United States Patent
Warner et al.

[19]

[11] Patent Number: 6,081,035
[45] Date of Patent: *Jun. 27, 2000

[54] MICROELECTRONIC BOND RIBBON DESIGN

[75] Inventors: Michael Warner, San Jose; Thomas H. Distefano, Monte Sereno; David Gibson, Palo Alto, all of Calif.

[73] Assignee: Tessera, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/736,415

[22] Filed: Oct. 24, 1996

Related U.S. Application Data

[60] Provisional application No. 60/006,078, Oct. 24, 1995.

[51] Int. Cl.[7] .......................... H01L 23/48; H01L 23/52; H01L 29/40
[52] U.S. Cl. ............................... 257/773; 257/775
[58] Field of Search .................. 257/776, 775, 257/773, 692; 174/260, 261, 262; 361/773, 774, 760, 767

[56] References Cited

U.S. PATENT DOCUMENTS

| | | |
|---|---|---|
| 4,859,806 | 8/1989 | Smith . |
| 5,041,901 | 8/1991 | Kitano et al. . |
| 5,127,570 | 7/1992 | Steitz et al. . |
| 5,148,265 | 9/1992 | Khandros et al. . |
| 5,148,266 | 9/1992 | Khandros et al. . |
| 5,173,574 | 12/1992 | Kraus . |
| 5,208,658 | 5/1993 | Murata ..................................... 257/775 |
| 5,398,863 | 3/1995 | Grube et al. ............................ 228/106 |
| 5,489,749 | 2/1996 | DiStefano et al. . |
| 5,491,302 | 2/1996 | DiStefano et al. ................... 174/261 X |
| 5,523,627 | 6/1996 | Abe et al. ................................ 257/775 |
| 5,619,017 | 4/1997 | Distefano et al. . |

FOREIGN PATENT DOCUMENTS

WO 94/03036   2/1994   WIPO .

*Primary Examiner*—Sheila V. Clark
*Attorney, Agent, or Firm*—Lerner, David, Littenberg, Krumholz & Mentlik, LLP

[57] ABSTRACT

An improved bond ribbon design, said bond ribbon having a dual taper that functions to localize the bending along a predetermined distribution of the bond ribbon during the bonding of the bond ribbon to an associated contact of a semiconductor chip. Use of the dual-tapered bond ribbons during bonding provides a bonded bond ribbon having a form that is substantially s-shaped. The radii of curvature making out the curves of the s-shaped configuration can be predetermined and controlled by the length and taper of the individual tapered section. The improved bond ribbon further comprises an anchor pad, said anchor pad characterized by a large surface area that decreases the likelihood of delamination of it from a supporting dielectric structure. A multiplicity of these improved bond ribbons can be fabricated in an external connection component so as to facilitate the alignment and bonding process of multiple bond ribbons to corresponding contacts of the semiconductor chip and can be designed, configured or placed such that the corner contact of the semiconductor chip are accessible for bonding. With respect to the problems associated with accessing the corner contacts of a semiconductor chip when using the connection component, three approaches are offered as solutions.

30 Claims, 6 Drawing Sheets

MICROELECTRONIC BOND RIBBON DESIGN

CROSS REFERENCE TO RELATED APPLICATIONS

The present application claims benefit of U.S. Provisional Application No. 60/006,078, filed Oct. 24, 1995.

FIELD OF THE INVENTION

The present invention relates to bond ribbon design for interconnecting semiconductor chips to supporting substrates.

BACKGROUND OF THE INVENTION

Integrated circuits of a semiconductor chip are connected to external circuitry through contacts on a surface of the chip. Typically, the contacts on the chip are disposed in rows extending parallel to and adjacent one or more edges on the active surface of the chip. The semiconductor chip is connected to a substrate that physically supports the chip. The substrate also provides electrical contacts that can be electrically connected to the contacts of the semiconductor chip. The substrate can be made part of a discrete chip package wherein the substrate supports a single chip and provides terminals for connecting to external circuit elements or, alternatively, in a so-called "hybrid circuit," one or more chips are mounted on a single substrate. In the hybrid approach the substrate not only physically supports the chip(s) but also functions as a circuit panel for interconnecting the chip(s) to other electrical components also mounted on the single substrate. In either case, the contacts of the chip must be connected to the contacts of the substrate. Traditionally, there have been four widely used interconnection methods: wire bonding, tape-automated bonding (or "TAB"), flip-chip bonding and beam lead bonding.

In wire bonding, the substrate has a top surface with a plurality of electrically conductive contact pads. The semiconductor chip has a face surface (i.e., the surface that bears the chip contacts) and a back surface. The chip is secured to the top surface of the substrate such that the back surface of the chip contacts with the top surface of the substrate and the substrate contacts surround the chip perimeter. Fine wires are then connected between the semiconductor contacts and the substrate contacts.

The tape automated bonding method uses a dielectric supporting tape, such as a thin film of polyimide having a hole slightly larger than the chip. An array of metallic leads is provided on one surface of the dielectric layer. These leads extend inwardly from around the hole toward the edges of the hole. Each lead has an innermost end projecting inwardly, beyond the edge of the hole. The innermost ends of the leads are arranged side by side at a spacing corresponding to the spacing of the contacts on the chip. The dielectric film is juxtaposed with the chip so that the hole is aligned with the chip and so that the innermost ends of the leads will extend over the front or contact bearing surface of the chip. The innermost ends of the leads are then bonded to the contacts of the chip, as by ultrasonic or thermocompression bonding. The outer ends of the leads are connected to external circuitry.

In flip-chip bonding, contacts on the front surface of the chip are provided with bumps of solder. The substrate has contacts arranged in an array corresponding to the array of contacts on the chip. The chip, with the solder bumps, is inverted so that its front surface faces towards the top surface of the substrate, with each contact and solder bump on the chip being positioned on the appropriate contact of the substrate. The assembly is then heated so as to liquefy the solder and bond each contact on the chip to the confronting contact of the substrate.

In a "beam lead" process, the chip is provided with individual leads extending from contacts on the front surface of the chip outwardly beyond the edges of the chip. The chip is positioned on a substrate with the outermost ends of the individual leads protruding over contacts on the substrate. The leads are then engaged with the contacts and bonded thereto so as to connect the contacts on the chip with contacts on the substrate.

Recent improvements in semiconductor interconnection methods can be found, for example, in commonly assigned U.S. Pat. Nos. 5,148,265 and 5,148,266 entitled "Semiconductor Chip Assemblies With Fan-In Leads" and "Semiconductor Chip Assemblies Having Interposer and Flexible Lead" respectively, the text of both such patents incorporated herein by reference. In part, the '265 and '266 patents disclose a semiconductor chip assembly method using an interposer. The interposer has a top surface with conductive terminals and a bottom surface. The interposer is laid over the central portion of the contact-bearing surface of the semiconductor chip such that the bottom surface of the interposer contacts the chip's contact-bearing surface and the peripheral contacts of the semiconductor chip are exposed. Contact leads are then interconnected between the semiconductor contacts and the terminals on the interposer. The terminals on the interposer are typically disposed in an area array. The interposer may also be provided with a compliant layer disposed between the terminals and the chip. Such a compliant layer permits slight vertical movement of the terminals toward the chip during testing and further absorb stresses applied to the leads thus improving the reliability of the interconnect.

Further improvements are described in commonly assigned U.S. Pat. No. 5,398,863 entitled "Shaped Lead Structure and Method" and commonly assigned U.S. Pat. No. 5,491,302 entitled "Microelectronic Bonding With Lead Motion."

In part, the '863 patent discusses the desirability of obtaining "s-shaped" bond ribbons that connect between the contacts of a support structure of the connection component and the contacts of the semiconductor chip. S-shaped bond ribbons are more reliable than kinked bond ribbons since they can better absorb forces directed at the bond ribbon due. However, while the '863 patent describes how the horizontal motion of the bonding tool can be controlled so as to obtain a better s-shaped bond ribbon, it does not disclose how design of the bond ribbon itself can facilitate the formation of the desired s-shaped bond ribbon. In part, U.S. Pat. No. 5,491,302 discloses how a single tapered section can be formed to approximate a beam of uniform strength in bending with respect to vertical forces applied by a bonding tool.

Despite the positive results of the aforementioned commonly owned inventions, still further improvements would be desirable.

SUMMARY OF THE INVENTION

One aspect of the present invention provides a novel bond ribbon design that reduces yield loss due to heel breaks and shoulder breaks due to fatigue of the bond ribbons. This aspect of the invention is fulfilled by the use of a dual taper in the bond ribbon that functions to optimize the radius of curvature of a bond ribbon after its has been bonded to a respective chip contact. The bond ribbon is comprised of a proximal section that connects to a support structure, a distal section that typically is connected to a frame of the external connection component, a first tapered section coupled to the proximal section, a neck section having a first end that connects to a first tapered section and a second end that connects to a second tapered section, and a bonding section that connects between the second tapered section and the distal section. The first and second tapered section have a width at the location where they connect to the neck that is narrower than their widths at their opposing ends. In other words, the width and hence that cross-sectional area of the major surfaces of the tapered sections increase progressively in a direction away from their connection at the neck section to their opposing ends.

The central and peripheral regions of the connection component are further typically comprised of a dielectric layer and a compliant layer. The dielectric material is preferably polyimide and connect to the proximal end of the bond ribbons. The compliant layer provides additional support for the assembly and functions to absorb forces applied to the bonded leads thus making the leads more reliable.

The dual taper nature of the bond ribbon characterizing this first aspect of the invention permits the formation of an s-shaped interconnection of the bond ribbon between the contacts of the semiconductor chip and the external support structure.

In other words, after a bonding process, the bonding section of the bond ribbon is substantially coplanar with the semiconductor chip, the proximal section remains substantially coplanar with the external support structure, and the neck section forms in a substantially s-shaped configuration therebetween. The tapers are designed so that a given vertical force at the bonding section site characteristic of a bonding tool, the maximum stress in bending is approximately the same between the regions of the bond tool between the tapered regions.

The s-shaped result can further be characterized by a first radius of curvature between the proximal section and the neck section and a second radius of curvature between the bonding section and the neck section. These radii of curvature can be predetermined and controlled by adjusting the length and taper of the first and second tapered sections.

A second aspect of the present invention contemplates the utilization of anchor pads to better secure the proximal end of a bond ribbon to the external support structure. The anchor pad is connected to the proximal section and has a larger major surface area than the proximal section. This aspect is beneficial since in the past the proximal section had a tendency to delaminate from the external support structure. If a portion of the anchor pad is extended over an edge of the external support structure, the anchor pad can also provide the additional function of moving the bending moment of the bond ribbon towards the neck section of the bond ribbon (i.e., away from the shoulder of the assembly) in much the same way as the tapered sections described above do.

The bond ribbon designs of the present invention can be attached to an external connection component that facilitates alignment and the bonding process. In such a case the connection component is comprised of: a detachable and substantially rectangular conductive frame, a central region within the frame, a peripheral region attached to the frame such that the peripheral region is separated from the central region by a bonding gap, a plurality of bond ribbons of the present invention wherein the distal ends of each of the bond ribbons are connected to the frame, the length of the bond ribbons extend over the bonding gap and the proximal ends of each of the bond ribbons connect to the central region. Additionally, a plurality of conductive terminals are fabricated on a top surface of the central region. Each conductive terminal is connected to an associated signal lead that further connects to the proximal end of a corresponding bond ribbon.

The connection component may further incorporate frangible sections near the distal sections and projections or tabs near the bonding section of the bond ribbon. A frangible section is comprised of a pair of opposing notches at the distal end of the bond ribbon. The frangible sections function as a means of detaching the bond ribbon from the frame of the connection component during the bonding process. The projections are used to stop the longitudinal motion of the bonding tool along the length of the bond ribbon during the bonding process.

Yet another aspect of the invention contemplates an approach to accessing the corner contacts of a semiconductor chip for purposes bonding using a connection component structure. Three approaches are disclosed. The first involves placement of the bond ribbons in the connection component such that they traverse a bonding gap at a predetermined angle rather than perpendicularly. The second approach utilizes an extension or bridge that projects from the central region of the connection component and canted leads having proximal ends that couple to the bridge to access the corner contact of a semiconductor chip. The third approach offered is a "dogleg" method. With this approach, the bonding ribbon associated with the corner contact of the semiconductor chip is curved in a dogleg fashion such that it does not interfere with adjacent bond ribbon associated with corresponding adjacent contacts of the semiconductor chip. Because this approach must have a substantially longer length of bond ribbon traversing the bonding gap compared to the other two approaches, this aspect of the invention also discloses how part of this length is made more rigid so as to avoid torsional forces applied to this length during the bonding process.

DETAILED DESCRIPTION OF THE PREFERRED EMBODIMENT

A first aspect of this invention relates to an improved bond ribbon design that reduces yield loss related to heel breaks and lifted bonds by reducing stresses on the bond ribbon during temperature cycling.

Figure 1:
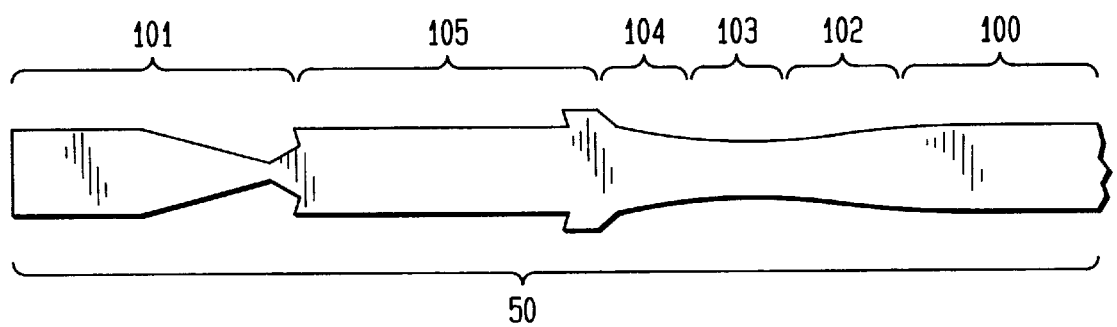
FIG. 1 is a plan view of one embodiment of the present invention illustrating the dual tapered nature of the present invention.

FIG. 1 shows one embodiment of a bond ribbon 50 of the present invention. The bond ribbon 50 is comprised of a proximal section 100, a distal section 101, a first tapered section 102, a neck section 103, a second tapered section 104 and a bonding section 105. Typical dimensions of these sections of the bond ribbon are: proximal end width=60 µm, first tapered section length (from proximal section to the neck section)=130 µm, neck section length=100 µm, neck section width=30 to 40 µm, second tapered section length=80 µm, bonding section width=45 to 50 µm, and bonding section length=125 µm. These dimensions are only typical and may vary depending on the application. For example, the bonding section length and width will vary depending on the size of the semiconductor contact, the bonding tool and the bond pitch.

Figure 2:
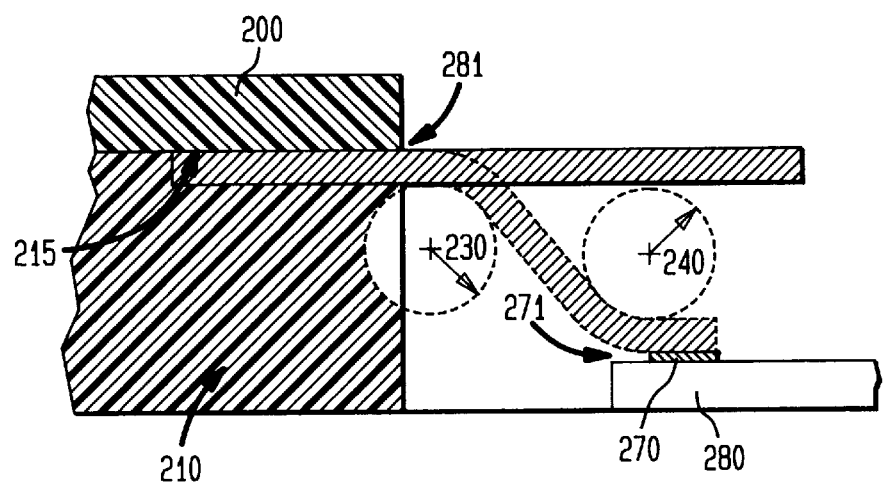
FIG. 2 is a fragmentary diagrammatic view, perspective view of a bond ribbon both before and after (dotted) a bonding process.

As illustrated in FIG. 2, the bond ribbon is typically attached to a bottom surface 215 of a dielectric layer 200 and further supported by an underlying compliant layer 210 at the proximal section of the bond ribbon. The dielectric layer 200 is typically comprised of polyimide while the compliant layer 210 is typically comprised of a low modulus material comprised of, for example a silicone, flexibilized epoxy or gel. The thickness of the dielectric layer is typically 50 µm and the thickness of the adjacent compliant layer is typically 150 µm. As explained in more detail below, the tapered regions of the bond ribbon are what principally control the bond ribbon shape during the bonding process. However, there are other factors that contribute to the resulting shape. For example, the thickness of the compliant layer 210 is also a factor since the bond ribbon length must translate from the plane of the bottom surface 215 of the dielectric layer 200 to the plane of the surface of the semiconductor chip 280.

FIG. 2 illustrates the shape of the bond ribbon 50 of FIG. 1 both before 250 and after 260 the bond ribbon 50 is bonded to a contact 270 of a semiconductor chip 280. During the bonding process a bonding tool 240 is positioned over the distal section 101 of the bond ribbon 50. The bonding tool 240 is then brought down towards the bond ribbon 50 such that the bonding tool 240 captures the distal section 101 of the bond ribbon 50. During this motion the bonding tool 240 slides along the bond ribbon length so as to guide the bonding section into contact with the contact 270 of the semiconductor chip 280. Because the neck section 103 of the bond ribbon 50 has a width that is smaller than both the adjacent first tapered section 102 and second tapered section 104, most of the compliance of the bond ribbon 50 occurs in the neck section 103. Thus the shape of the bond ribbon 50 after positioning the bonding section 105 of the bond ribbon 50 next to the contact 270 of the semiconductor chip 280 is substantially s-shaped. After the bonding section 105 is positioned over the contact 270 of the semiconductor chip 280, the bonding tool 240 is driven against the bond ribbon 50 at the bonding section 105 and ultrasonic energy is applied to form a bond between the bonding section 105 and the contact 270 of the semiconductor chip 280.

After the bonding process the distal section 101 and the bonding section 105 are substantially coplanar with the semiconductor chip 280 and a large first radius of curvature 240 between the bonding section 105 and the neck section 103 is observed. Similarly, the proximal end 100 of the bond ribbon 50 is substantially coplanar with the dielectric layer 200 and a large second radius of curvature 230 is observed between the proximal section 100 and the neck section 103. These radii of curvature can be controlled and predetermined by varying the length and width of the tapered sections with respect to the width of the neck section to obtain optimum results. Without the tapered sections these carefully controlled radii of curvature would not be so exactly formed and, instead, kinked transitions might be obtained at both the heel 271 and shoulder 281 of the assembly. Kinked transitions, particularly at the heel 271, have proven unreliable, especially during thermal cycling of the resultant chip package, since a substantial amount of the thermally generated stress/strain on the bond ribbon 50 is localized at the kinked sections of the bond ribbon. Use of tapering, curved transitions creates a stress/strain gradient along the lead thereby making a break less likely to occur.

In some configurations, the bond ribbon has one or more projections or "tabs" that project outward from the bond ribbon length between the bonding section 105 and the second tapered section 104 of the bond ribbon 50. The tabs function as a limit stop for the bonding tool 240 as the bonding tool 240 slides along the bond ribbon length during the bonding and lead-shaping motion described above. Use of the tabs also assists the bonding tool 240 in more consistently capturing the bond ribbon 50 and positioning it next to the contact 270 of the semiconductor chip 280. During the lead-shaping motion, the bonding tool 240 is brought down in contact with the bond ribbon 50 on the distal section 101 such that the bond ribbon 50 is forced into a groove in the bonding tool 240. Because the width of the bond ribbon 50 near the tabs is wider than the groove in the bonding tool 240, the tabs stop the bonding tool from sliding along the bond ribbon. Besides providing for more consistent capturing and positioning of the bond ribbon 50 next to an associated contact 270 of a semiconductor chip 280, the tabs also mechanically stiffen the heel 271 since the width of the bond ribbon 50 near the tabs is wider than the width of the adjacent second tapered section 104 and bonding section 105. This stiffening effect acts to further move the compliance region toward the neck 103 of the bond ribbon 50 and away from the heel 271.

Figure 3:
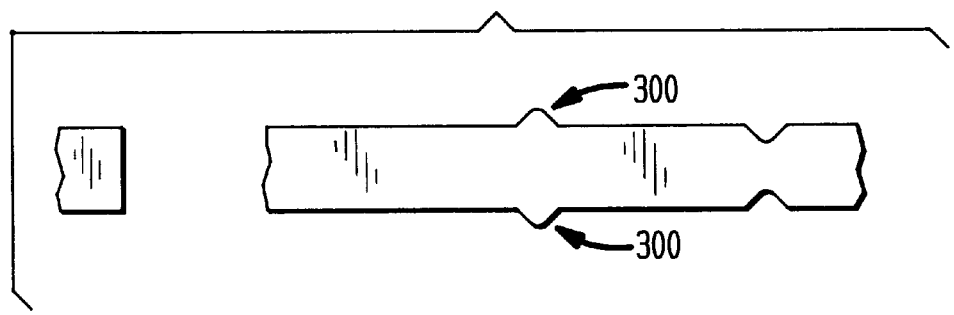
FIG. 3 is a plan view of the embodiment of FIG. 1 but further having opposing projections near the bonding region that act as a limit stop for a bonding tool during a bonding process.
Figure 4:
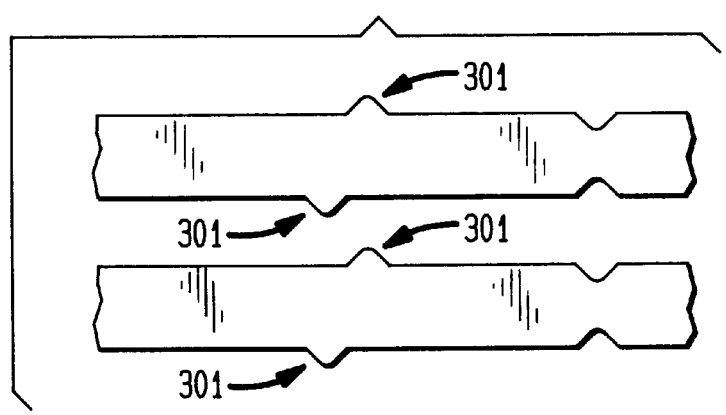
FIG. 4 is a plan view of two adjacent embodiments of FIG. 1 but each further having nested projections that act as a limit stop for a bonding tool and provide for a higher pitch of adjacent bond ribbons over that obtainable using the opposing projections of FIG. 3.

FIG. 3 shows the use of two oppositely disposed tabs 300 on a bond ribbon 50. FIG. 4 shows an alternate embodiment that employs nested tabs 301. Use of such nested tabs 301 is useful when bonding multiple and adjacent bond ribbons to corresponding contacts of a semiconductor chip since a finer pitch between adjacent bond ribbons can be obtained.

Figure 5:
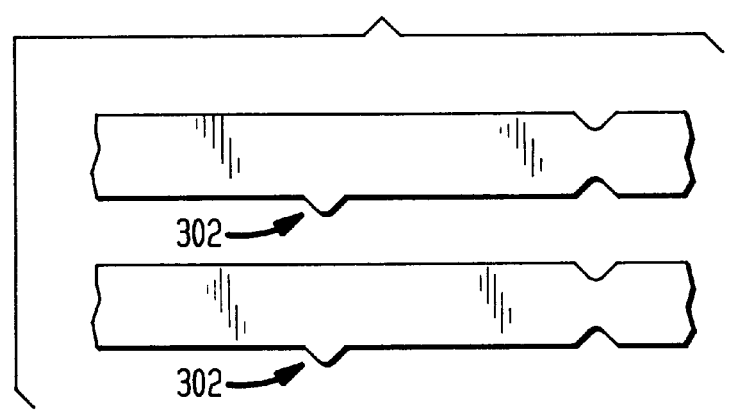
FIG. 5 is a plan view of two adjacent embodiments of FIG. 1 but each further having a single projection on one edge that acts as a limit stop for a bonding too and provides for a higher pitch of adjacent bond ribbons over that obtainable using the opposing projections of FIG. 3.

Without the nested tabs 301, the tabs of adjacent bond ribbons may interfere with each other thus limiting the pitch. A smaller pitch can also be obtained using bond ribbons having only a single tab 302 as illustrated in the alternate embodiment of FIG. 5.

Figure 6:
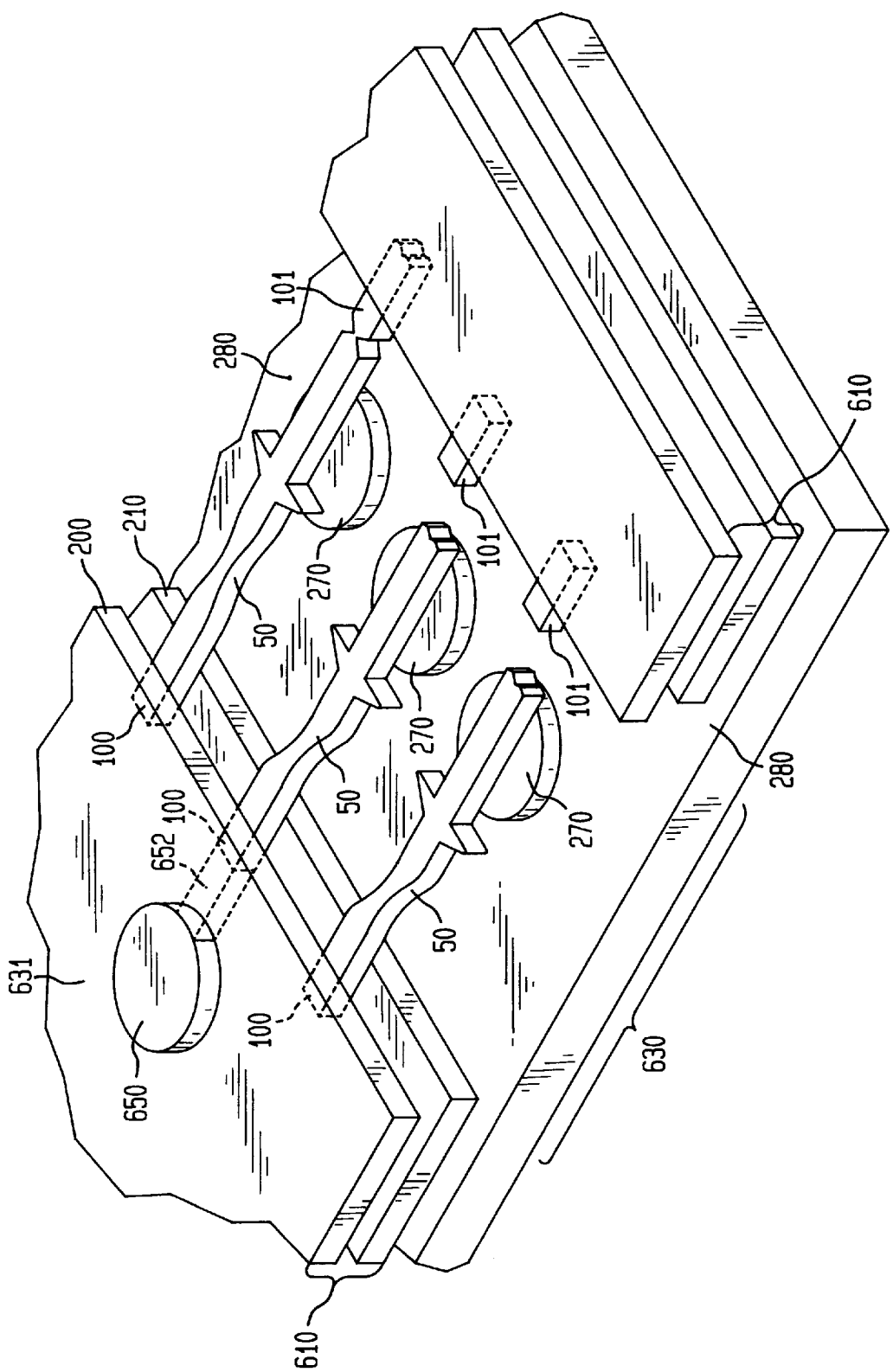
FIG. 6 is a fragmentary, diagrammatic, perspective view illustrating a connection between a semiconductor chip and an external connection component, said connection component supporting the types of bond ribbons of the present invention.

Preferably, a multiplicity of the bond ribbons described above are attached to a support structure or connection component so that the bond ribbons 50 can be more systematically bonded to a corresponding multiplicity of peripheral contacts 270 on a semiconductor chip 280. A component structure that can be utilized to accomplish this result is shown in FIG. 6. The connection component is comprised of a conductive frame (not shown in FIG. 6), a central region 610 within the frame perimeter and a peripheral region 620 attached to the frame such that the peripheral region 620 is separated from the central region 610 by a bonding gap 630. The distal sections 101 of the bond ribbons are attached to the frame 600 of the connection component and the proximal sections 100 are attached to the central region 610 of the connection component such that the length of each bond ribbon extends over the bonding gap 630. The connection component also has a plurality of conductive terminals 650 (only one shown in FIG. 6) on a top surface 631 of the central region 610, each conductive terminal 650 having an associated signal lead 652 that connects between it and a corresponding proximal section 100 of a bond ribbon 50. These conductive terminals 650 may be in the form of solder balls, configured in a ball grid array, so that the entire assembly can be soldered to a substrate (e.g., a printed wiring board) having a footprint that matches the configuration of the array. FIG. 6 shows two bond ribbons 50 after they have been bonded to their associated contacts 270 on the semiconductor chip 280. Notice how the bonded bond ribbons have the preferred s-shaped configuration.

Figure 7A:
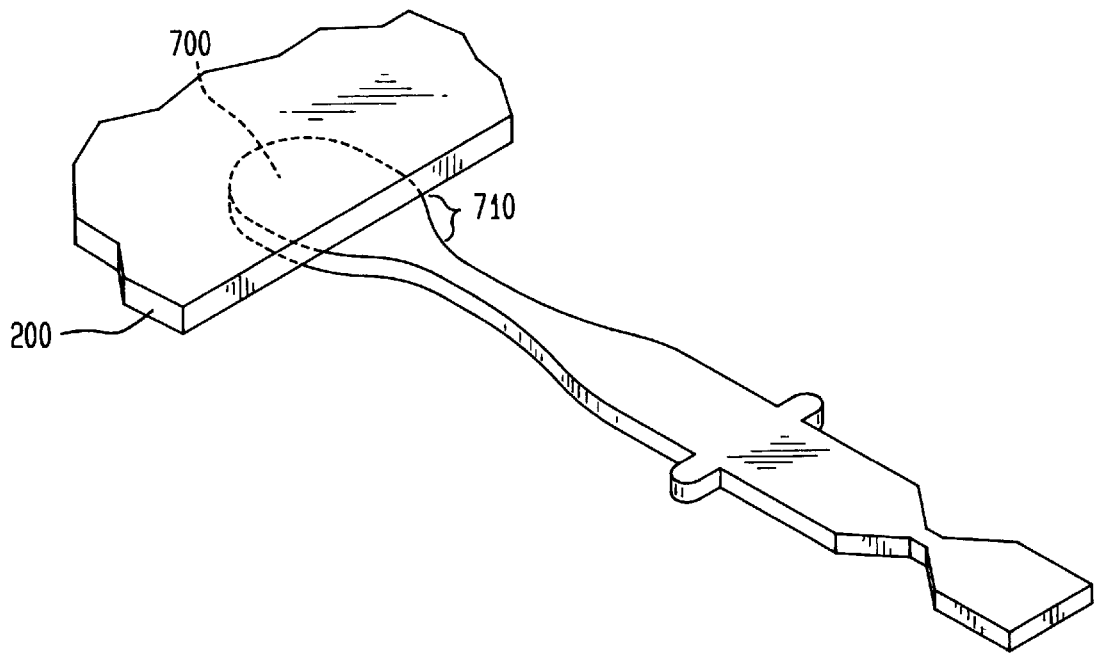
FIG. 7a is a fragmentary, diagrammatic, perspective view showing the use of anchor pads contemplated by the present invention.
Figure 7B:
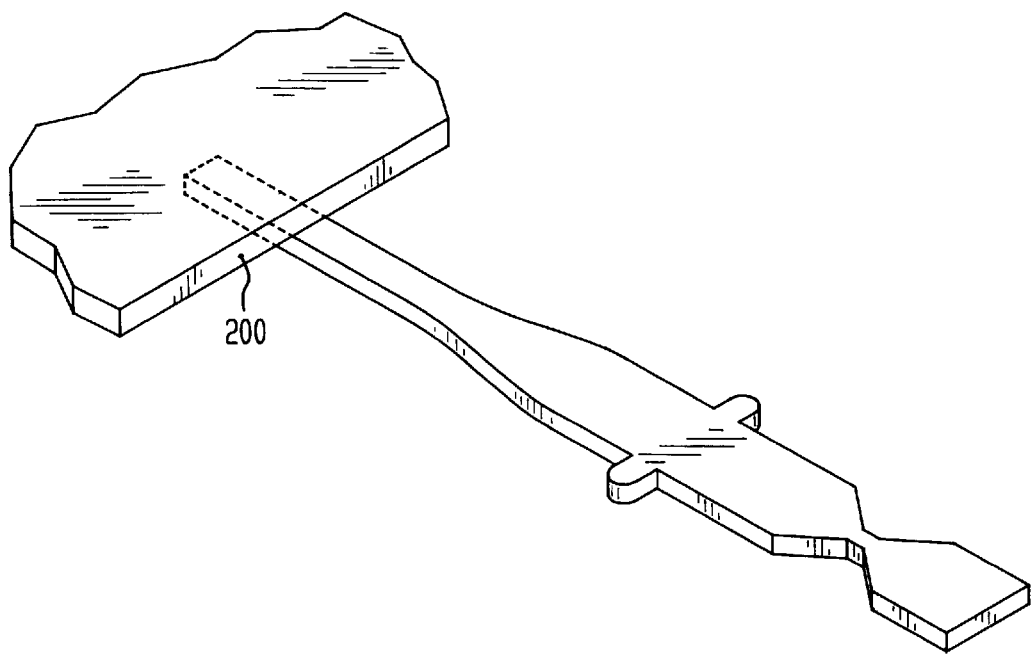
FIG. 7b is a fragmentary, diagrammatic, perspective view showing a prior art solution.

Reliability problems associated with the attachment of the proximal section 100 of the bond ribbons to the central region 610 is another aspect of the present invention. As explained above, the central region 610 is typically comprised of a thin dielectric layer 200, preferably polyimide and a compliant layer 210. During the manufacture of the connection component a metal sheet is laminated over the dielectric layer 200 and bond ribbons 50 are subsequently patterned using a photolithographic process that is well known in the art. Prior to this invention, reliability of the attachment area of the bond ribbon 50 and dielectric layer 200 were a problem due to a tendency of the metallic bond ribbon to delaminate from the attachment area of the dielectric layer 200. The likelihood of delamination can be decreased by utilizing anchor pads having a larger surface area than the proximal section of the bond ribbons. FIG. 7a illustrates use of such an anchor pad 700. The larger surface area of the anchor pad 700 compared to a prior method not utilizing an anchor pad (FIG. 7b) produces a stronger lamination and therefore increases the reliability of the attachment site. Because the process of delamination is observed to start near the edge of the dielectric layer 200 the anchor pad 700 is preferably positioned so that it extends somewhat over the edge of the dielectric layer 200. This anchor pad extension 710 is shown in FIG. 7a.

In addition to improving the reliability of the lamination of the bond ribbon to the dielectric layer 200, the anchor pad extension 710 can also localize the bend of the bond ribbon during the lead forming process. Localization of the bend is difficult without the anchor extension 710 because the bonding gap 630 (see FIG. 6) cannot be patterned with absolute certainty. The process of patterning the bonding gap 630 involves the use of a laser and a mask defining the bonding gap 630. The walls of the bonding gap 630 define the edge position 631 of the central region 610 and the inner perimeter 621 of the peripheral region 620. Due to mask alignment limitations, however, there can be up to 25 μm of uncertainty in the edge position 631 of the central region 610 after the laser forms the bonding gap 630. Moreover, heat damage to the edges of the central region 610 during the lasing step also affects the certainty of the edge position 631 of the central region 610. Thus, if the prior art method of attachment is used (i.e., if an anchor pad extension 710 is not used), there is a corresponding 25 μm length along the bond ribbon where the bend can form during the bonding process. The wider anchor pad 700 projecting over the edge 631 of the central region 610 acts to localize the bending moment (i.e., eliminate the uncertainty in the bend location), in a manner similar to the operation of the tapered sections of the bond ribbon functioning to move the bend to the more compliant neck region 103 during the lead forming process. Although not necessary, this similarity in function allows the anchor pad 700 itself to comprise the first tapered section 102 of the bond ribbon 50 depicted in FIG. 1. To insure that the anchor pads 700 are reliably attached to the central region 610 and have sufficient surface area to localize the bending moment they are typically designed to extend 50 to 90 μm over the predicted edge of the central region 610. If it is shaped correctly, the anchor pad can also be used in place of a tapered section near the dielectric layer 200.

Figure 8:
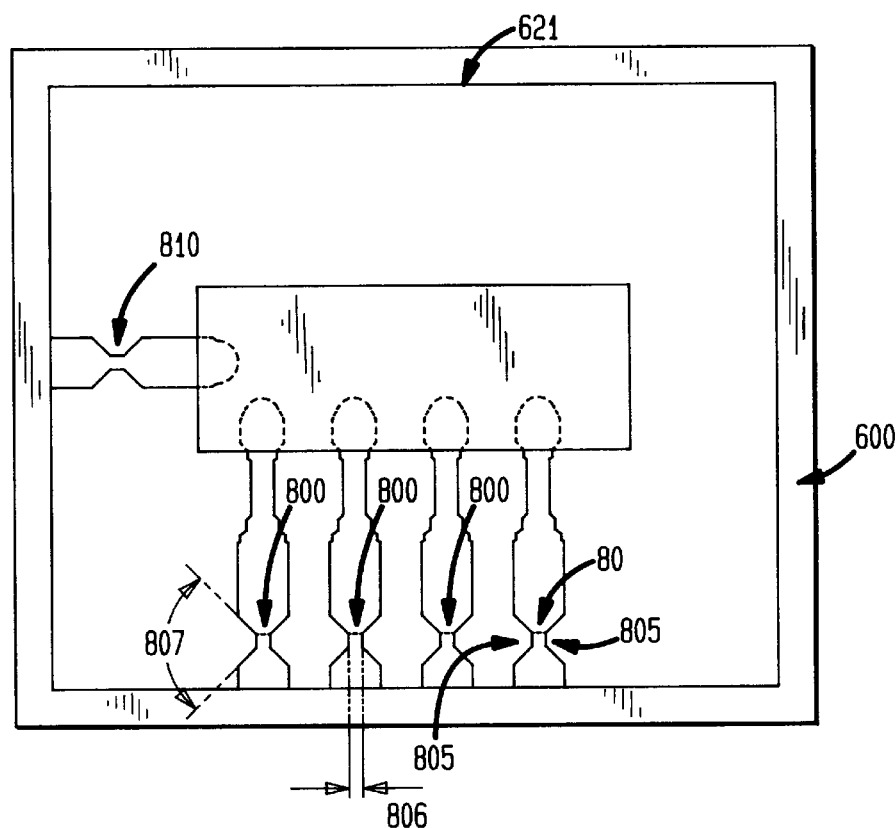
FIG. 8 is a plan view illustrating the use of frange points connecting the bond ribbons of the present invention frame of the connection component.

The connection component must provide some means of detaching the distal ends of the bond ribbons from the frame during the bonding process. As shown in FIG. 8, the detachment mechanism of the present invention contemplates the use of a frange point 800 connected between the distal section 101 and the bonding section 105 of the bond ribbon. The frange point 800 is comprised of a pair of opposing notches 805. During the bonding process the bonding tool puts tension on the bonding ribbon and breaks the frange point 800 thus separating the bond ribbon from the frame 600. The width of the frange point 806 is dependent upon the lead dimensions; however, with a lead that is approximately 18 μm, the frange point 806 is preferably approximately 12 to 14 μm and the angle 807 of the notches is preferably approximately 120 degrees. The shallow angle 807 is preferred because sharper angles tend to get filled in during plating or etching resulting in less of a notch-like feature. The 12 to 14 μm range in width 806 of the frange point 800 is chosen as a tradeoff between having enough strength for handling but not so much strength as to prevent controlled and repeatable breaking of the frange point 800 during the bonding process. The distance between the frange point 800 and the peripheral region edge 621 of the bonding gap 630 also involves a tradeoff. A long distance, e.g., over 100 μm, allows the bonding tool 240 to come closer to the frange point 800 when the bond ribbon is broken away. A shorter distance, on the other hand (e.g., less than 40 μm), both consumes less area and produces a shorter "tail" (i.e., the excess bond ribbon material between the bond and the frange point 800). A long tail can short to its neighbors and may penetrate the compliant layer 210. Thus the preferred distance is somewhere between 40 and 100 μm. Frange points may also be positioned around the perimeter of the frame in addition to the frange point locations for the bond ribbons to provide additional support of the connection component during the bonding process. These frame frange points 810 are also shown in FIG. 8.

Another aspect of the present invention contemplates methods of accessing corner contacts of a semiconductor chip so that they can be bonded to. As shown in FIG. 6, typically the bond ribbons project perpendicularly toward the central region of the connection component. However, if the semiconductor chip has a first row of contacts along a first edge of the chip periphery and a second row of contacts along a second edge of the periphery of the chip such that the first row is orthogonal to the second row, bonding access to the contact at the corner becomes a problem. The present invention addresses this problem by providing for three different approaches to accessing corner contacts: the angle approach, the bridge approach, and a dogleg approach.

Figure 9:
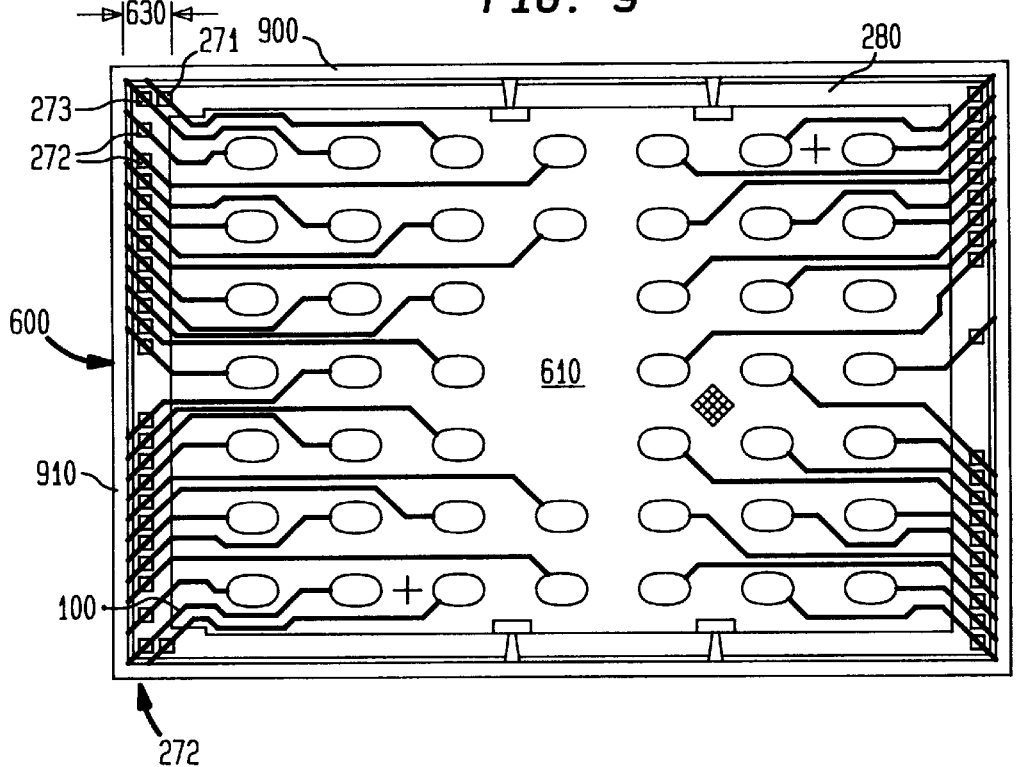
FIG. 9 is a plan view illustrating the angle approach to accessing the corner contact of a semiconductor chip for purposes of bonding.

The angle approach of corner contact access is shown in FIG. 9. A semiconductor chip 280 has a first row of contacts 271 aligned parallel to a first edge 900 of the frame 600 and a second row of contacts 272 aligned parallel to a second edge 910 of the frame 600. As FIG. 9 illustrates, the contacts are orthogonally situated such that the row of contacts terminates at a corner contact 273. Use of bond ribbons that perpendicularly extend across the bonding gap 630 would prevent access to the corner contact 273 since the area of the central region 610 needed to connect to the proximal section 100 of such a perpendicular bond ribbon would already be occupied by the proximal sections 100 of bond ribbons associated with contacts adjacent the corner contact. However, if the bond ribbons are situated so as to traverse the bonding gap 630 at a set angle, the corner contact 273 is accessible. As shown in FIG. 9, if this angle method is used, other contacts in the first row of contacts 271 and second row of contacts 272 are also accessible using the same set angle across the bonding gap 630.

Figure 10:
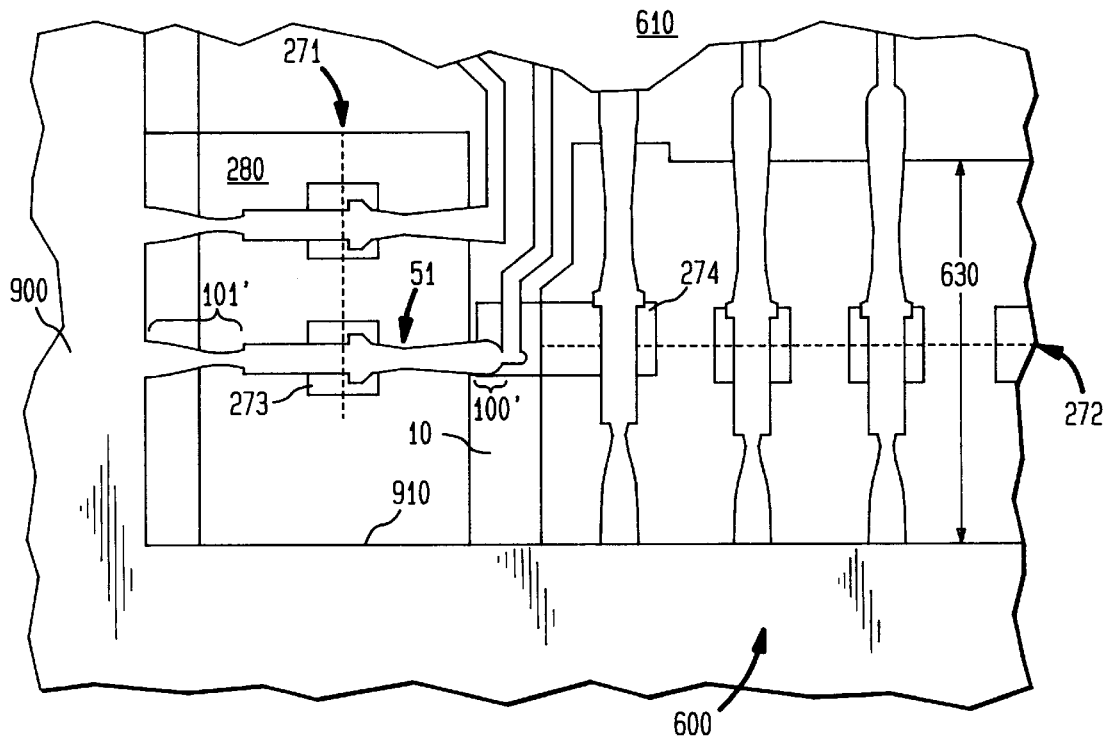
FIG. 10 is a plan view illustrating the bridge approach to accessing a corner contact of a semiconductor chip for purposes of bonding.
Figure 11:
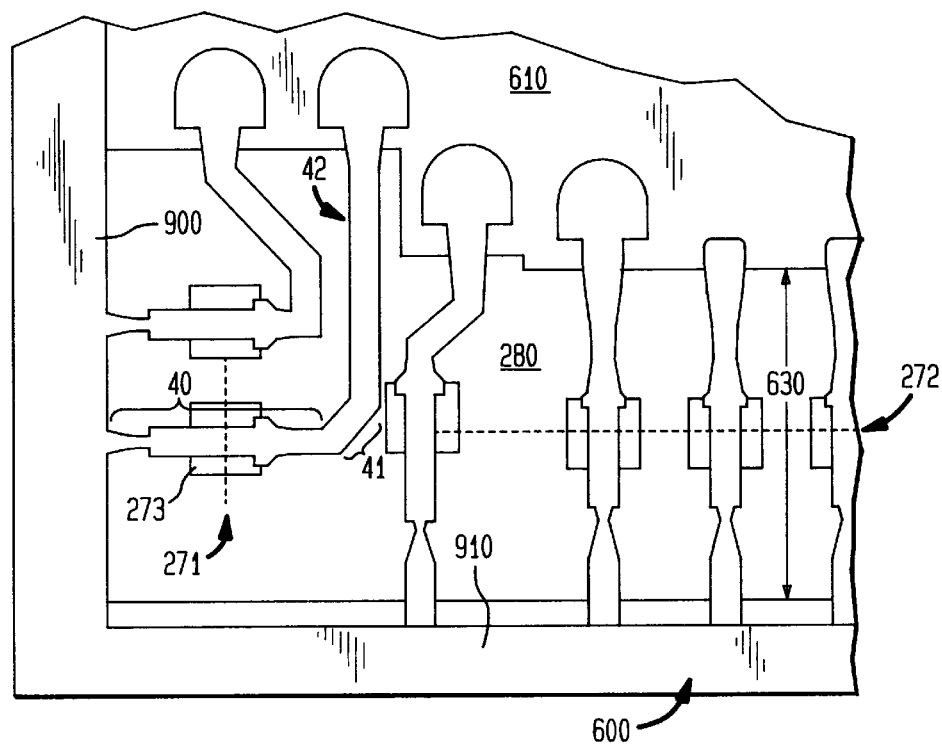
FIG. 11 is a plan view illustrating the dogleg approach to accessing the corner contact of a semiconductor chip for purposes of bonding.

An alternate embodiment using a "bridge" approach is shown in FIG. 10. In this embodiment the corner contact is accessed by using a shorter, canted bond ribbon 51 and a support bridge 10. As shown in FIG. 11, a semiconductor chip 280 has a first row of contacts 271 aligned parallel to a first edge 900 of the frame 600 and a second row of contacts 272 aligned parallel to a second edge 910 of the frame 600. The two rows of contacts are orthogonally situated and converge at a corner contact 273. The distal section 100 of a canted bond ribbon 51 connects to the first edge 900 of the frame 600 and the proximal section 101 (or anchor pad 700, if it is used) of the canted bond ribbon 51 connects to a support bridge 10 that extends from the central region 610 between the corner contact 273 and the adjacent contact 274 of the second row of contacts 272. Thus the support bridge 10 extends the central region 610 so that it provides the additional surface area needed for connecting the proximal section 101 of the canted bond ribbon 51 to the central region 610. Other contacts in the first row of contacts 271 are also accessible using canted bond ribbons 51, the number limited by the availability of space on the support bridge 10. The support bridge 10 also supports the signal leads associated with the canted bond ribbons 51. The second edge of the frame 910 connects to the distal sections 100 of bond ribbons associated with the second row of contacts 272. These bond ribbons are of normal length.

A third alternate embodiment, shown in FIG. 11, uses a "dogleg" approach to access a corner contact. Like the two other approaches, in this embodiment, a semiconductor chip has a first row of contacts 271 aligned parallel to a first edge 900 of the frame 600 and a second row of contacts 272 aligned parallel to a second edge 910 of the frame 600 such that the two rows of contacts are orthogonally situated and converge at a corner contact 273. The bond ribbon associated with a corner contact has three sections: a distal section 40 having a first end connected to the connection component frame 600, a proximal section 42 with a first end connected to the central region 610 of the connection component, and a central section 41 connected between the opposing end of the distal section 40 and the opposing end of the proximal section 42. The central section 41 functions to translate the bond ribbon 50 from a direction of translation parallel to the length of the distal section 40 to a direction of translation that is parallel to the length of the proximal section 42 so that the bond ribbon does not interfere with adjacent bond ribbons 50'. Preferably the proximal section 42 is substantially parallel to the first edge 900 of the frame 600 while the distal section 40 is substantially perpendicular to the first edge 900 of the frame 600 such that the angles of intersection of the translation section with the opposing ends of the proximal and distal sections are between 110 and 160 and most preferably both 135 degrees. The central section may have one or more angles or may follow the line of a curve between the proximal and distal sections.

Use of the dogleg approach results in a substantial length of the bond ribbon extending across the bonding gap. This additional length combined with the non linear translation of the bond ribbon over the bonding gap can cause problems during the lead forming process. During the bonding process the downward force of the bonding tool creates a torsion in the length of the bond ribbon that extends across the bonding gap. To prevent this torsional effect, a rigid portion of the central section of the bond ribbon is more rigid than the distal section and remaining central section of the bond ribbon so that after the bond ribbon is connected to a corner contact on the semiconductor chip the rigid portion remains substantially planar in comparison to the distal section and remaining central section. Typically the increased rigidity can be accomplished simply by increasing the width of the proximal section relative to the widths of the distal and translation sections. This rigidity may also be accomplished by increasing the thickness of the proximal lead.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A conductive bond ribbon that connects to a semiconductor chip contact from a dielectric support structure wherein said bond ribbon has first and second major surfaces and an edge surface therebetween, the bond ribbon further comprising:

a proximal section connected to the support structure;

a distal section extending beyond a periphery of the support structure;

a neck section between the proximal and distal sections, wherein the first and second surfaces of the neck section are narrower than the corresponding first and second surfaces of the proximal and distal sections;

a first tapered section between the neck section and the proximal section;

a second tapered section between the neck section and the distal section; and a bonding section between the second tapered section and the distal section.

2. The bond ribbon as claimed in claim 1, wherein, after the bonding section of the bond ribbon has been downset and connected to a chip contact, the first tapered section of the bond ribbon has a radius of curvature and the second tapered section has a radius of curvature.

3. The bond ribbon as claimed in claim 2, wherein the downset bond ribbon is substantially "s" shaped.

4. The bond ribbon as claimed in claim 3, wherein the first and second radii of curvature are optimized and controlled by adjusting the length and gradualness of the first and second tapered sections.

5. The bond ribbon as claimed in claim 1, further including an anchor pad connected to the proximal section wherein said anchor pad has first and second surfaces that are larger than the corresponding first and second surfaces of the proximal section, whereby the larger first and second surfaces decrease the likelihood that the anchor pad will detach from the support structure.

6. The bond ribbon as claimed in claim 5, wherein the anchor pad includes the proximal section.

7. The bond ribbon as claimed in claim 6, wherein the anchor pad includes the first tapered section.

8. The bond ribbon of claims 1 or 5 further comprising one or more projections between the bonding section and the second tapered section wherein said projections extend outwardly from the edge surface of the bond ribbon.

9. A connection component for connecting conductive bond ribbons to contacts of a semiconductor chip from a dielectric support structure, said connection component comprised of:
  a conductive frame lying on a peripheral region;
  the support structure lying within a central region within the frame so that there is a bonding gap between at least a portion of the support and the conductive frame;
  a plurality of conductive bond ribbons, the bond ribbons each having first and second major surfaces and an edge surface therebetween, a proximal section connected to the support structure, a distal section extending beyond a periphery of the support structure, a neck section between the proximal and distal sections wherein the first and second surfaces of the neck section are narrower than the corresponding first and second surfaces of the proximal and distal sections, a first tapered section between the neck section and the proximal section, a second tapered section between the neck section and the distal section, and a bonding section between the second tapered section and the distal section, wherein the distal sections of the bond ribbons are connected to the frame so that each bond ribbon extends over the bonding gap; and
  a plurality of conductive terminals on a top surface of the support structure, each conductive terminal being electrically connected to a respective proximal section of a corresponding bond ribbon.

10. The connection component as claimed in claim 9, further including an anchor pad connected to the proximal section wherein said anchor pad has first and second surfaces that are larger than the corresponding first and second surfaces of the proximal section, whereby the larger first and second surfaces decrease the likelihood that the anchor pad will detach from the support structure.

11. The connection component as claimed in claims 9 or 10 wherein the support structure and peripheral region are each further comprised of a dielectric layer having a top and bottom surface, wherein the first surface of the proximal sections of each bond ribbon connects to the bottom surface the support structure, and a compliant layer is attached the bottom surface of the support structure.

12. The connection component as claimed in claims 9 or 10 wherein the support structure and peripheral region are further comprised of a dielectric layer having a top and bottom surface, wherein the second surface of the proximal sections of each bond ribbon connects to the top surface of the support structure, and a compliant layer is attached to the bottom surface of the support structure.

13. The connection component as claimed in claims 9 or 10 wherein at least one bond ribbon near a corner of the frame extends over the bonding gap at a predetermined angle, whereby the corner contacts of a semiconductor chip are accessible for bonding using such corner located bond ribbons.

14. The connection component as claimed in claims 9 or 10, wherein the support structure further includes a bridge portion that extends across the bonding gap and connects to the peripheral region, wherein a corner bond ribbon is connected to the bridge at its proximal section and extends across the bonding gap substantially orthogonally with respect to the bridge and is further connected to the frame, whereby the corner bond ribbon may be more easily connected to a corner contact on the semiconductor chip.

15. A bond ribbon on a semiconductor chip connection component for bonding to a respective corner contact of a semiconductor chip, the bond ribbon comprising:
  a proximal section connected to the connection component;
  a distal section being releasably connected to a peripheral component;
  a central section extending beyond a periphery of the connection component and interconnecting the proximal and distal sections across a bonding gap between the connection component and the peripheral component, the central section being such that the proximal and distal sections do not lie in a straight line with respect to one another when the proximal and distal sections are connected to the central section and the distal section is connected to the peripheral component.

16. The bond ribbon as claimed in claim 15, wherein the distal section is substantially perpendicular to the proximal section and the central section has at least one obtuse inner angle.

17. The bond ribbon as claimed in claim 16, wherein the central section of the bond ribbon has two inner angles, each inner angle being between 110 and 160 degrees.

18. The bond ribbon as claim in claim 15, wherein the central section of the bond ribbon follows the line of a curve between the proximal and distal sections.

19. The connection component as claimed in claims 9 or 10, further comprising a frangible section between the distal section and the bonding section whereby during a bonding process the frangible section is broken so as to disconnect the bond ribbon from the frame.

20. A bond ribbon on a semiconductor chip connection component for bonding to a respective corner contact of a semiconductor chip, the bond ribbon comprising:
  a proximal section connected to the connection component;
  a distal section being releasably connected to a peripheral component;
  a central section extending beyond a periphery of the connection component and interconnecting the proximal and distal sections across a bonding gap between the connection component and the peripheral component, the central section being such that the proximal and distal sections do not lie in a straight line with respect to one another, wherein a rigid portion of the central section of the bond ribbon near the proximal section is more rigid that the distal section and remaining central section of the bond ribbon so that after the bond ribbon is connected to a corner contact on the semiconductor chip the rigid portion remains more planar and better resists torsional forces in comparison to the distal section and the remainder of the central section.

21. The bond ribbon as claimed in claim 20, wherein the rigid portion is made more rigid by making it wider than the distal section and the remaining central section.

22. The bond ribbon as claimed in claim 20, wherein the rigid portion is made more rigid by making it thicker than the distal section and the remaining central section.

23. A bond ribbon on a semiconductor chip connection component for bonding to a respective corner contact of a semiconductor chip, the bond ribbon comprising:
   a proximal section connected to the connection component;
   a distal section being releasably connected to a peripheral component;
   a central section extending beyond a periphery of the connection component and interconnecting the proximal and distal sections across a bonding gap between the connection component and the peripheral component, the central section being such that the proximal and distal sections do not lie in a straight line with respect to one another as viewed in plan view.

24. The bond ribbon as claimed in claim 23, wherein the distal section is substantially perpendicular to the proximal section and the central section has at least one obtuse inner angle.

25. The bond ribbon as claimed in claim 24, wherein the central section of the bond ribbon has two inner angles, each inner angle being between 110 and 160 degrees.

26. The bond ribbon as claim in claim 23, wherein the central section of the bond ribbon follows the line of a curve between the proximal and distal sections.

27. The bond ribbon as claimed in claim 24, wherein a rigid portion of the central section of the bond ribbon near the proximal section is more rigid that the distal section and remaining central section of the bond ribbon so that after the bond ribbon is connected to a corner contact on the semiconductor chip the rigid portion remains more planar and better resists torsional forces in comparison to the distal section and the remainder of the central section.

28. The bond ribbon as claimed in claim 27, wherein the rigid portion is made more rigid by making it wider than the distal section and the remaining central section.

29. The bond ribbon as claimed in claim 27, wherein the rigid portion is made more rigid by making it thicker than the distal section and the remaining central section.

30. The bond ribbon as claimed in claim 15, wherein the distal section and the proximal section are co-planar.

* * * * *

UNITED STATES PATENT AND TRADEMARK OFFICE
CERTIFICATE OF CORRECTION

PATENT NO. : 6,081,035
DATED : June 27, 2000
INVENTOR(S) : Warner et al.

It is certified that error appears in the above-identified patent and that said Letters Patent is hereby corrected as shown below:

Title Page, Item [57] Abstract, line 19, "are" should read --is--.

Column 2,
Line 35, "absorb" should read --absorbs--.

Column 3,
Line 1, "its" should read --it--.
Line 20, "connect" should read --connects--.

Column 4,
Line 2, "extend" should read --extends--.
Line 46, delete "view".
Line 60, "too" should read --tool--.

Column 10
Line 18, after "non linear" should read --non-linear--.

UNITED STATES PATENT AND TRADEMARK OFFICE
CERTIFICATE OF CORRECTION

PATENT NO. : 6,081,035　　　　　　　　　　　　　　　　　　　　　　Page 2 of 2
DATED : June 27, 2000
INVENTOR(S) : Warner et al.

It is certified that error appears in the above-identified patent and that said Letters Patent is hereby corrected as shown below:

Column 11,
Line 58, after "surface" insert --of--.
Line 59, after "attached" insert --to--.

Column 12,
Line 64, "that" should read --than--.

Column 14,
Line 10, "that" should read --than--.

Signed and Sealed this

Third Day of July, 2001

*Attest:*

NICHOLAS P. GODICI
*Attesting Officer*　　*Acting Director of the United States Patent and Trademark Office*